(12) United States Patent
Lee et al.

(10) Patent No.: US 7,893,894 B2
(45) Date of Patent: Feb. 22, 2011

(54) ORGANIC LIGHT EMITTING DISPLAY AND DRIVING CIRCUIT THEREOF

(75) Inventors: Hyungjung Lee, Yongin-si (KR); Kyunghoon Chung, Yongin-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 737 days.

(21) Appl. No.: 11/857,758

(22) Filed: Sep. 19, 2007

(65) Prior Publication Data
US 2008/0211797 A1 Sep. 4, 2008

(30) Foreign Application Priority Data
Mar. 2, 2007 (KR) .................. 10-2007-0020738

(51) Int. Cl.
*G09G 3/30* (2006.01)
(52) U.S. Cl. .......................... 345/76; 345/82
(58) Field of Classification Search ................ 345/82, 345/76, 98–100
See application file for complete search history.

(56) References Cited

U.S. PATENT DOCUMENTS

| 6,621,886 B2 * | 9/2003 | Kawahata | 377/1 |
| 2004/0104882 A1 * | 6/2004 | Kitani et al. | 345/100 |
| 2005/0156859 A1 * | 7/2005 | Jang et al. | 345/100 |
| 2008/0030439 A1 * | 2/2008 | Shin | 345/82 |

FOREIGN PATENT DOCUMENTS

| KR | 10-2002-0059216 | 7/2002 |
| KR | 10-2002-0059218 | 7/2002 |
| KR | 10-2002-0085205 | 11/2002 |
| KR | 10-2007-0032870 | 3/2007 |

* cited by examiner

*Primary Examiner*—Chanh Nguyen
*Assistant Examiner*—Jeffrey Parker
(74) *Attorney, Agent, or Firm*—Stein McEwen, LLP (57) ABSTRACT

An organic light emitting display and a driving circuit therefor to prevent a variation in scanning signals supplied to scan lines due to coupling capacitance caused by scan lines and data lines that intersect each other and to prevent a variation in the scanning signals due to a leakage current from an output terminal. The display and driving circuit include first, second, and third scan drivers each electrically coupled to each of first, second and third clock lines to control output signals to scan lines. The display and driving circuit may include multiple scan drivers and multiple clock lines, which correspond to a total number of scan lines.

30 Claims, 7 Drawing Sheets

ORGANIC LIGHT EMITTING DISPLAY AND DRIVING CIRCUIT THEREOF

CROSS-REFERENCE TO RELATED APPLICATIONS

This application claims the benefit of Korean Patent Application No. 2007-20738, filed Mar. 2, 2007, in the Korean Intellectual Property Office, the disclosure of which is incorporated herein by reference.

BACKGROUND OF THE INVENTION

1. Field of the Invention

Aspects of the present invention relate to an organic light emitting display and a driving circuit therefor, and more specifically, to an organic light emitting display and a driving circuit thereof capable of preventing a leakage current.

2. Description of the Related Art

In recent years, organic light emitting display have been used as display devices of portable information terminals, such as personal computers, mobile phones, and PDAs, or display devices of various information apparatuses. In addition, various types of light emitting display devices have been developed to have smaller weights and sizes than a cathode ray tube. In particular, organic light emitting display having high luminescent efficiency, brightness, and a wide viewing angle have drawn attention as display devices.

An organic light emitting display according to the related art includes an organic light emitting display panel having pixels electrically coupled between scan lines and data lines intersecting the scan lines, a scan driver supplying a scan signal to the scan lines, and a data driver supplying a scan signal to the data lines. The scan driver supplies scan signals to the organic light emitting display panel through the scan lines in sequence, and the data driver supplies data signals to the organic light emitting display panel through the data lines in sequence. The organic light emitting display panel is electrically coupled to the data lines and the scan lines and is supplied with the data signals and the scan signals to thereby emit light.

In such an organic light emitting display panel, as the scan lines and the data lines intersect each other in a matrix structure, a parasitic capacitor is formed at intersections of the data lines and the scan lines, which causes coupling capacitance. Therefore, a problem exists that the scan signals sequentially supplied from the scan driver to the scan lines may vary due to the coupling capacitance caused by the data lines intersecting the scan lines.

SUMMARY OF THE INVENTION

Accordingly, aspects of the present invention has been contrived to solve the above-described and/or other problems, and an aspect of the present invention is to provide an organic light emitting display and a driving circuit therefor capable of preventing scan signals supplied to scan lines from varying due to coupling capacitance caused by scan lines and data lines intersecting each other in an organic light emitting display panel.

Another aspect of the invention is to provide an organic light emitting display and a driving circuit therefor capable of preventing a variation in scan signals due to a leakage current from an output terminal.

According to an aspect of the invention, a driving circuit includes a first scan driver that has a first clock terminal electrically coupled to a first clock line, a second clock terminal electrically coupled to a second clock line, and a third clock terminal electrically coupled to a third clock line; a second scan driver that has a first clock terminal electrically coupled to the second clock line, a second clock terminal electrically coupled to the third clock line, and a third clock terminal electrically coupled to the first clock line; and a third scan driver that has a first clock terminal electrically coupled to the third clock line, a second clock terminal electrically coupled to the first clock line, and a third clock terminal electrically coupled to the second clock line.

The first scan driver may further include an input terminal electrically coupled to an initial input line and an output terminal electrically coupled to a first scan line. In the first scan driver, the first clock terminal may be electrically coupled to the first clock line, the second clock terminal may be electrically coupled to the second clock line, and the third clock terminal may be electrically coupled to the third clock line.

The second scan driver may further include an input terminal electrically coupled to the first scan line electrically coupled to the output terminal of the first scan driver and an output terminal electrically coupled to a second scan line. In the second scan driver, the first clock terminal may be electrically coupled to the second clock line, the second clock terminal may be electrically coupled to the third clock line, and the third clock terminal may be electrically coupled to the first clock line.

The third scan driver may further include an input terminal electrically coupled to the second scan line electrically coupled to the output terminal of the second scan driver and an output terminal electrically coupled to a third scan line. In the third driver, the first clock terminal may be electrically coupled to the third clock line, the second clock terminal may be electrically coupled to the first clock line, and the third clock terminal may be electrically coupled to the second clock line.

Each of the first scan driver, the second scan driver, and the third scan driver may include a first switching element that has a control electrode electrically coupled to the second clock terminal and is electrically coupled between an input line and the first clock terminal; a second switching element that has a control electrode electrically coupled to the first switching element and is electrically coupled between the third clock terminal and an output line; a third switching element that has a control electrode electrically coupled to the first switching element and is electrically coupled between the first clock terminal and a first power supply line; a fourth switching element that has a control electrode electrically coupled to the first clock terminal and is electrically coupled between the third switching element and the first power supply line; a fifth switching element that has a control electrode electrically coupled between the third switching element and the fourth switching element and is electrically coupled between a second power supply line and the output line; a sixth switching element that has a control electrode electrically coupled to the first switching element and is electrically coupled between the first power supply line and the second power supply line; a seventh switching element that has a control electrode electrically coupled to the first clock terminal and is electrically coupled between the first power supply line and the sixth switching element; an eighth switching element that has a control electrode electrically coupled between the sixth switching element and the seventh switching element and is electrically coupled between the control electrode of the sixth switching element and the second power supply line; and a storage capacitor that is electrically coupled between the control electrode of the second switching element and the output line.

The input line may be the initial input line or the output line of the scan driver in a previous stage. The output line may be the scan line electrically coupled to pixel circuits.

The first switching element may have the control electrode electrically coupled to the second clock terminal, a first electrode electrically coupled to the initial input line, and a second electrode electrically coupled between the control electrode of the second switching element and the control electrode of the fourth switching element. The second switching element may have the control electrode electrically coupled to the control electrode of the third switching element, a first electrode electrically coupled to the third clock terminal, and a second electrode electrically coupled to a first output line.

The third switching element may have the control electrode electrically coupled to the control electrode of the second switching element, a first electrode electrically coupled to the first clock terminal, and a second electrode electrically coupled between the first electrode of the fourth switching element and the control electrode of the fifth switching element. The fourth switching element may have the control electrode electrically coupled to the first clock terminal, a first electrode electrically coupled to the control electrode of the fifth switching element, and a second electrode electrically coupled to the first power supply line.

The fifth switching element may have the control electrode electrically coupled between the third switching element and the fourth switching element, a first electrode electrically coupled to the second power supply line, and a second electrode electrically coupled to the first output line. The sixth switching element may have the control electrode electrically coupled between the control electrode of the second switching element and the control electrode of the fourth switching element, a first electrode electrically coupled to the second power supply line, and a second electrode electrically coupled to the control electrode of the eighth switching element.

The seventh switching element may have the control electrode electrically coupled to the first clock terminal, a first electrode electrically coupled to the first power supply line, and a second electrode electrically coupled to the control electrode of the eighth switching element. The eighth switching element may have the control electrode electrically coupled between the sixth switching element and the seventh switching element, a first electrode electrically coupled to the control electrode of the second switching element, and a second electrode electrically coupled to the second power supply line.

The storage capacitor may have a first electrode electrically coupled to the control electrode of the second switching element and a second electrode electrically coupled to the first output line.

The first scan driver may have the first clock terminal electrically coupled to the first clock line, the second clock terminal electrically coupled to the second clock line, the third clock terminal electrically coupled to the third clock line, and the output terminal electrically coupled to a first scan line. The second scan driver may have the first clock terminal electrically coupled to the second clock line, the second clock terminal electrically coupled to the third clock line, the third clock terminal electrically coupled to the first clock line, and the output terminal electrically coupled to a second scan line. The third scan driver may have the first clock terminal electrically coupled to the third clock line, the second clock terminal electrically coupled to the first clock line, the third clock terminal electrically coupled to the second clock line, and the output terminal electrically coupled to a third scan line.

In this way, the organic light emitting display and the driving circuit therefor according to aspects of the invention can prevent the scan signals supplied to the scan lines from varying due to coupling capacitance caused by the scan lines and the data lines intersecting each other in an organic light emitting display panel and prevent a variation in the scan signals due to a leakage current from an output terminal.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Components having the same or similar structures and functions are denoted by the same reference numerals through the entire specification. In addition, an electrical connection between two portions or two features that are "electrically coupled" include direct connection between the two portions as well as electrical connection between the two portions or features between which a third element or multiple elements may be disposed. In addition, the size and proportions of features may be exaggerated for clarity.

Figure 1:
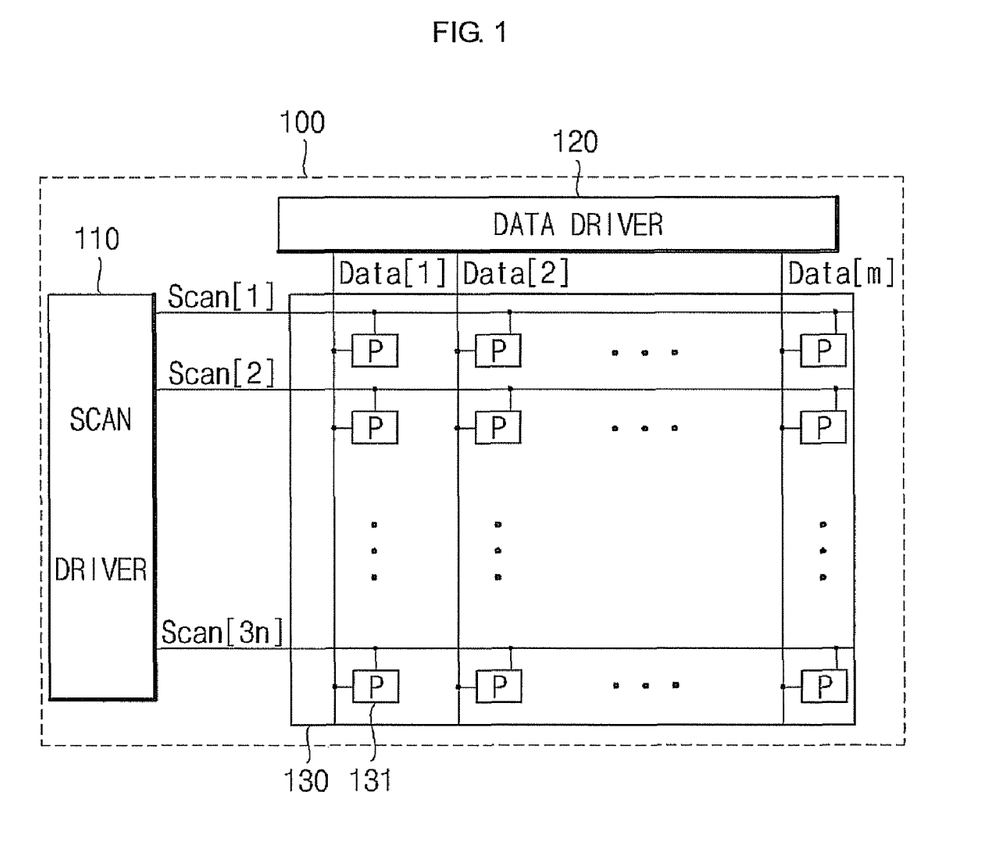
FIG. 1 is a block diagram illustrating the structure of an organic light emitting display according to aspects of the present invention.

FIG. 1 is a block diagram illustrating the structure of an organic light emitting display according to the present invention. As described in FIG. 1, an organic light emitting display 100 may include a scan driver 110, a data driver 120, and an organic light emitting display panel 130 (hereinafter, referred to as a panel 130). The panel 130 may include a plurality of scan lines (Scan[1], Scan[2], . . . , Scan[3n]) arranged in a row direction, a plurality of data lines (Data[1], Data[2], . . . , Data[m]) arranged in a column direction, and pixel circuits 131 defined by the plurality of scan lines (Scan[1], Scan[2], ..., Scan[3n]) and the plurality of data lines (Data [1], Data[2], ..., Data[m]). The scan driver 110 may supply scan signals to the panel 130 in sequence through the scan lines (Scan[1], Scan[2], ..., Scan[3n]). The data driver 120 may supply data signals to the panel 130 in sequence through the data lines (Data[1], Data[2], Data[m]).

Each of the pixel circuits may be formed in a pixel region defined by two adjacent scan lines and two adjacent data lines. As described above, the scan signals may be supplied from the scan driver 110 to the scan lines (Scan[1], Scan[2], ..., Scan[3n]), and the data signals may be supplied from the data driver 120 to the data lines (Data[1], Data[2], ..., Data[m]).

The panel 130 is supplied with a first power supply source (not shown) and a second power supply source (not shown), and the first and second power supply sources supply power to the pixel circuits 131. Each of the pixel circuits 131 supplied by power from the first and second power supply sources controls a current flowing from the second power supply source to the first power supply source through a light emitting element. Each of the pixel circuits 131 controls the current and causes the light emitting element to emit light according to a grayscale level corresponding to the data signal.

Figure 2:
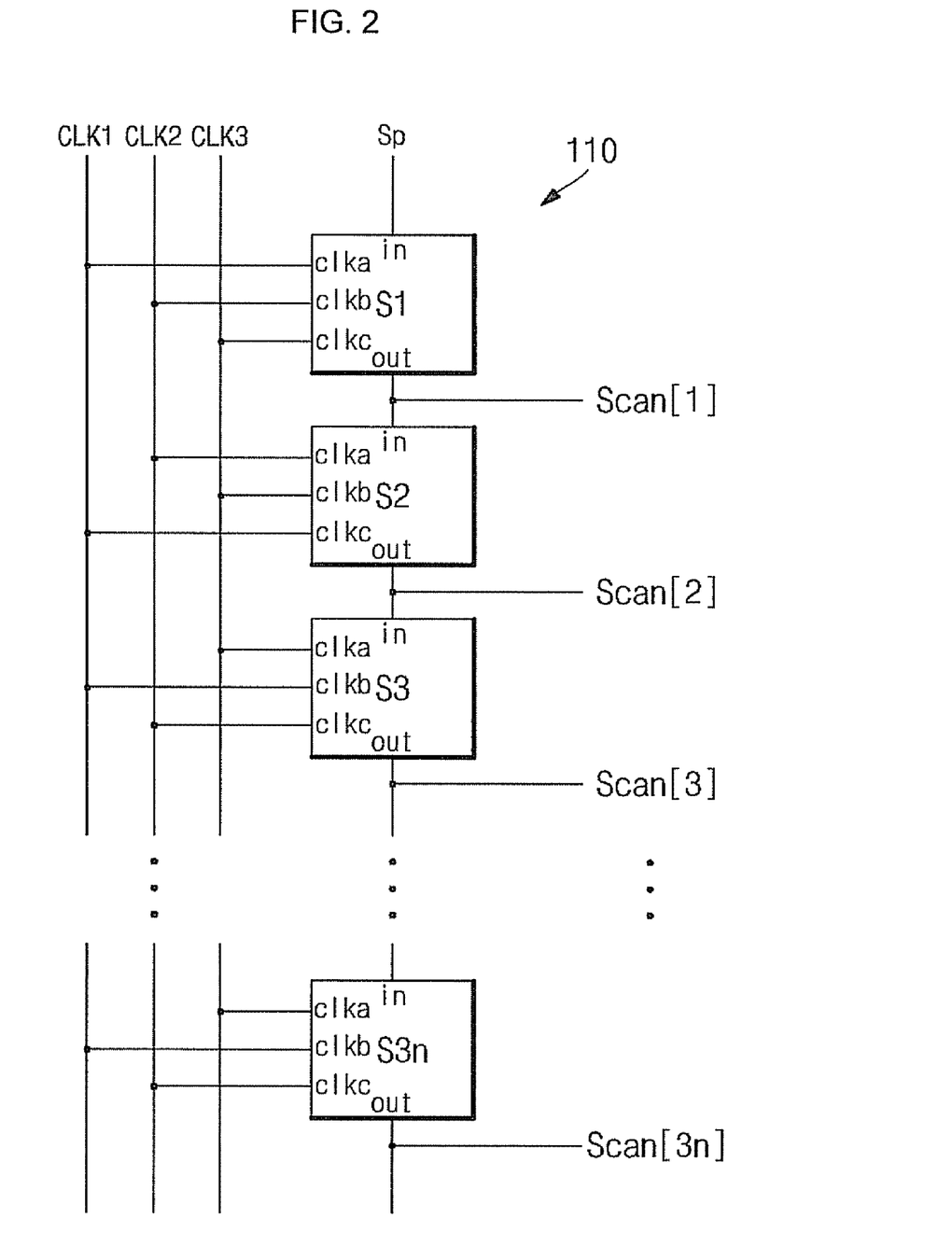
FIG. 2 is a block diagram illustrating a scan driver according to aspects of the present invention.

FIG. 2 is a block diagram illustrating the structure of the scan driver according to an aspect of the invention. As shown in FIG. 2, the scan driver 110 includes first to 3n-th scan drivers (S1 to S3n). The first scan driver (S1) has a first clock terminal (clka) electrically coupled to a first clock line (CLK1), a second clock terminal (clkb) electrically coupled to a second clock line (CLK2), and a third clock terminal (clkc) electrically coupled to a third clock line (CLK3). In addition, the first scan driver (S1) includes an input terminal (In) electrically coupled to an initial driving line (Sp) to receive an initial driving signal, and an output terminal (Out) outputting a first scan signal to the first scan line (Scan[1]).

The second scan driver (S2) has a first clock terminal (clka) electrically coupled to the second clock line (CLK2), a second clock terminal (clkb) electrically coupled to the third clock line (CLK3), and a third clock terminal (clkc) electrically coupled to the first clock line (CLK1). In addition, the second scan driver (S2) includes an input terminal (In) electrically coupled to the first scan line (Scan[1]) to receive the first scan signal, and an output terminal (Out) outputting a second scan signal to the second scan line (Scan[2]). That is, the input terminal (In) of the second scan driver (S2) is electrically coupled to the first scan line (Scan[1]) before being electrically coupled to the second scan line (Scan[2]) so as to receive the first scan signal output to the first scan line (Scan [1]) before outputting the second scan signal to the second scan line (Scan[2]).

The third scan driver (S3) has a first clock terminal (clka) electrically coupled to the third clock line (CLK3), a second clock terminal (clkb) electrically coupled to the first clock line (CLK1), and a third clock terminal (clkc) electrically coupled to the second clock line (CLK2). In addition, the third scan driver (S3) includes an input terminal (In) electrically coupled to the second scan line (Scan[2]) to receive the second scan signal, and an output terminal (Out) outputting a third scan signal to the third scan line (Scan[3]). That is, the input terminal (In) of the third scan driver (S3) is electrically coupled to the second scan line (Scan[2]) before being electrically coupled to the third scan line (Scan[3]) so as to receive the second scan signal output to the second scan line (Scan [2]) before outputting the third scan signal to the third scan line (Scan[3]).

The connection structure of clock terminals (clka to clkc) of each of a fourth scan driver (S4), a seventh scan driver (S7), ..., and a (3n−2)-th scan driver (S3n-2) is the same as that of the first scan driver. In addition, the fourth scan driver (S4), the seventh scan driver (S7), ..., and the (3n-2)-th scan driver (S3n-2) have input terminals (In) electrically coupled to the previous scan lines (Scan[3], Scan[6], ..., and Scan [3n-3]) and output terminals (Out) outputting the scan signals to the scan lines (Scan[4], Scan[7], ..., and Scan[3n-2]), respectively. That is, the input terminals (In) of the fourth scan driver (S4), the seventh scan driver (S7), ..., and the (3n−2)-th scan driver S3n-2 are electrically coupled to the scan lines (Scan[3], Scan[6], ..., and Scan[3n-3]) so as to receive the scan signals therefrom and output the fourth, seventh, ..., and 3n−2 scan signals, respectively.

The connection structure of clock terminals (clka to clkc) of each of a fifth scan driver (S5), an eighth scan driver (S8), ..., and a (3n−1)-th scan driver (S3n-1) is the same as that of the second scan driver. In addition, the fifth scan driver (S5), the eighth scan driver (S8), ..., and the (3n−1)-th scan driver (S3n-1) have input terminals (In) electrically coupled to the previous scan lines (Scan[4], Scan[7], ..., and Scan [3n-2]) and output terminals (Out) outputting the scan signals to the scan lines (Scan[5], Scan[8], ..., and Scan[3n-1]), respectively. That is, the input terminals (In) of the fifth scan driver (S5), the eighth scan driver (S8), ..., and the (3n−1)-th scan driver (S3n-1) are electrically coupled to the scan lines (Scan[4], Scan[7], ..., and Scan[3n-2]) so as to receive the scan signals therefrom and output the fifth, eighth, ..., and 3n−1 scan signals, respectively.

The connection structure of clock terminals (clka to clkc) of each of a sixth scan driver (S6), a ninth scan driver (S9), ..., and a 3n-th scan driver (S3n) is the same as that of the third scan driver. In addition, the sixth scan driver (S6), the ninth scan driver (S9), ..., and the 3n-th scan driver (S3n) have input terminals (In) electrically coupled to the previous scan lines (Scan[5], Scan[8], ..., and Scan[3n-1]) and output terminals (Out) outputting the scan signals to the scan lines (Scan[6], Scan[9], ..., and Scan[3n]), respectively. That is, the input terminals (In) of the sixth scan driver (S6), the ninth scan driver (S9), ..., and the 3n-th scan driver (S3n) are electrically coupled to the scan lines (Scan[5], Scan[8], ..., and Scan[3n-1]) to the scan lines (Scan[6], Scan[9], ..., Scan[3n]) to receive the scan signals therefrom and output the sixth, ninth, ..., and 3n scan signals, respectively.

Figure 3:
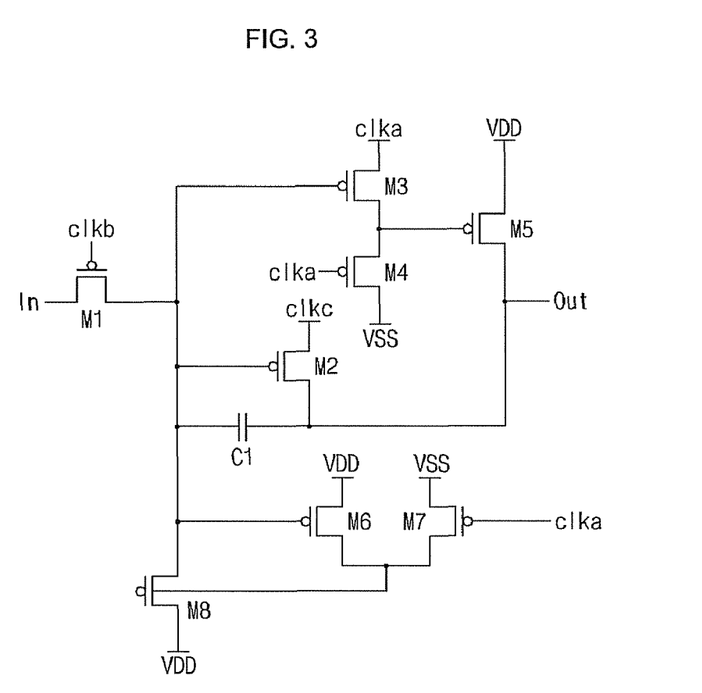
FIG. 3 is a circuit diagram illustrating a scan driver described in FIG. 2.

FIG. 3 is a circuit diagram illustrating the scan driver described in FIG. 2. All the scan drivers described below have the same scan driving circuit as the scan driver described in FIG. 2. That is, the first to 3n-th scan drivers have the same scan circuit described in FIG. 3. As illustrated in FIG. 3, the scan driving circuit includes a first switching element (M1), a second switching element (M2), a third switching element (M3), a fourth switching element (M4), a fifth switching element (M5), a sixth switching element (M6), a seventh switching element (M7), an eighth switching element (M8), and a storage capacitor (C1).

The first switching element (M1) has a first electrode (a drain electrode or a source electrode) electrically coupled to the input terminal (In), a second electrode (a source electrode or a drain electrode) electrically coupled to control electrodes of the second, third, and sixth switching elements (M2, M3, and M6), and a control electrode (a gate electrode) electrically coupled to the second clock terminal (clkb). When a low-level signal is supplied to the control electrode of the first switching element (M1), the first switching element (M1) is turned on, so that the signal input to the input terminal (In) is supplied to the control electrodes of the second, third, sixth switching elements (M2, M3, and M6). That is, the first switching element (M1) is an initial driving switching element that supplies a signal for the initial driving of the scan circuit to each element to drive each element.

The second switching element (M2) has a first electrode electrically coupled to the third clock terminal (clkc), a second electrode electrically coupled to the output terminal (Out), and a control electrode electrically coupled to the second electrode of the first switching element (M1) between the control electrodes of the third and sixth switching elements (M3 and M6). When the low-level signal transmitted from the first switching element (M1) is supplied to the control electrode of the second switching element (M2), the second switching element (M2) outputs a clock signal input to the third clock terminal (clkc) to the output terminal (Out).

The third switching element (M3) has a first electrode electrically coupled to the first clock terminal (clka), a second electrode electrically coupled between a first electrode of the fourth switching element (M4) and a control electrode of the fifth switching element (M5), and a control electrode electrically coupled to the second electrode of the first switching element (M1) between the control electrodes of the second and sixth switching elements (M2 and M6). When the low-level signal transmitted from the first switching element is supplied to the control electrode of the third switching element (M3), the third switching element (M3) outputs a clock signal input to the first clock terminal (clka) to the control electrode of the fifth switching element (M5).

The fourth switching element (M4) has a first electrode electrically coupled to the control electrode of the fifth switching element (M5), a second electrode electrically coupled to a first power supply source (VSS), and a control electrode electrically coupled to the first clock terminal (clka). When a low-level clock signal is supplied from the first clock terminal (clka) to the control electrode of the fourth switching element (M4), the fourth switching element (M4) supplies a first power supply source (VSS) to the control electrode of the fifth switching element (M5).

The fifth switching element (M5) has a first electrode electrically coupled to a second power supply source (VDD), a second electrode electrically coupled to the output terminal (Out), and a control electrode electrically coupled between the third and fourth switching elements (M3 and M4). When the low-level signal is supplied from the third or fourth switching element (M3 or M4) to the control electrode of the fifth switching element (M5), the fifth switching element (M5) outputs a second power supply source (VDD) to the output terminal (Out).

The sixth switching element (M6) has a first electrode electrically coupled to the second power supply source (VDD), a second electrode electrically coupled to the control electrode of the eighth switching element (M8), and a control electrode electrically coupled to the second electrode of the first switching element (M1) between the control electrodes of the second and third switching elements (M2 and M3). When the low-level signal is supplied from the first switching element (M1) to the control electrode of the sixth switching element (M6), the sixth switching element (M6) applies the second power supply source (VDD) to the control electrode of the eighth switching element (M8).

The seventh switching element (M7) has a first electrode electrically coupled to the first power supply source (VSS), a second electrode electrically coupled to the control electrode of the eighth switching element (M8), and a control electrode electrically coupled to the first clock terminal (clka). When a low-level clock signal input to the first clock terminal (clka) is supplied to the control electrode of the seventh switching element (M7), the seventh switching element (M7) applies the first power supply source (VSS) to the control electrode of the eighth switching element (M8).

The eighth switching element (M8) has a first electrode electrically coupled to the control electrode of the sixth switching element (M6), a second electrode electrically coupled to the second power supply source (VDD), and a control electrode electrically coupled between the sixth and seventh switching elements (M6 and M7). When the low-level signal transmitted from the seventh switching element (M7) is supplied to the control electrode of the eighth switching element (M8), the eighth switching element (M8) applies the second power supply source (VDD) to the storage capacitor (C1) to initialize the voltage stored in the storage capacitor (C1) and to fix the voltages of the control electrodes of the second, third, and sixth switching elements (M2, M3, and M6) to the second power supply source (VDD).

The storage capacitor (C1) has a first electrode electrically coupled to the control electrode of the second switching element (M2) and a second electrode electrically coupled between the output terminal (Out) and the second electrode of the second switching element (M2). The storage capacitor (C1) stores a voltage difference between the control electrode and the second electrode of the second switching element (M2).

Figure 4:
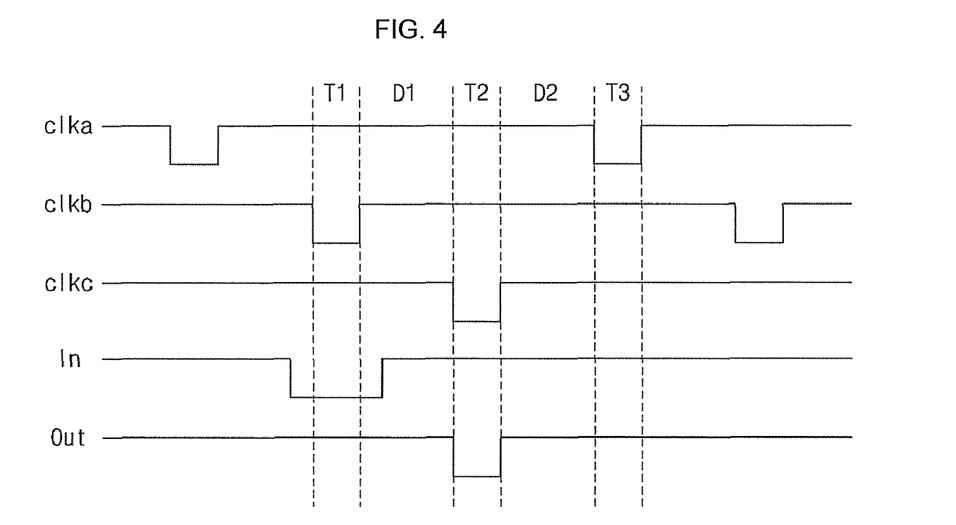
FIG. 4 is a timing chart illustrating the operation of a scan circuit described in FIG. 3.

FIG. 4 is a timing chart illustrating the operation of the scan circuit illustrated in FIG. 3. The operation of the scan circuit illustrated in FIG. 3 will be described below. As shown in FIG. 4, the timing chart of the scan circuit includes a first driving period (T1), a first delay period (D1), a second driving period (T2), a second delay period (D2), and a third driving period (T3).

In the first driving period (T1), high-level clock signals are input to the first and third clock terminals (clka and clkc) to turn off the fourth and seventh switching elements (M4 and M7), and a low-level clock signal is input to the second clock terminal (clkb) to turn on the first switching element (M1). When the first switching element (M1) is turned on, a low-level input signal input to the input terminal (In) is supplied to the control electrodes of the second, third, and sixth switching elements (M2, M3, and M6) to turn on the second, third, and sixth switching elements (M2, M3, and M6) via the first switching element (M1). When the second switching element (M2) is turned on, the high-level clock signal input to the third clock terminal (clkc) is transmitted to the output terminal (Out). At that time, the storage capacitor (C1) is electrically coupled between the control electrode of the second switching element (M2) and the output terminal (Out) to store a voltage corresponding to the difference between the low level of the control electrode of the second switching element (M2) and the high level of the output terminal (Out). When the third switching element (M3) is turned on, the high-level clock signal input to the first clock terminal (clka) is transmitted to the control electrode of the fifth switching element (M5) to turn off the fifth switching element (M5). When the sixth switching element (M6) is turned on, the second power supply source (VDD) is supplied to the control electrode of the eighth switching element (M8) to turn off the eighth switching element (M8). That is, in the first driving period (T1), the low-level input signal transmitted through the first switching element (M1) turns on the second switching element (M2), so that the high-level signal input to the third clock terminal (clkc) is output as an output signal.

Next, before the low-level clock signal is input to the third clock terminal (clkc), the high levels of the clock signals input to the clock terminals partially overlap each other during the first delay period (D1), which prevents an error in the output of the scan signal from the scan driver caused by the delay of each element during the operation of the scan circuit. At that time, the second, third, and sixth switching elements (M2, M3, and M6) are turned on by the voltage stored in the storage capacitor (C1), so that the same output signal as the output signal in the first driving period (T1) is output. That is, in this structure, the signal output from the output terminal of the scan driving circuit can be maintained in a non-floating state, which makes it possible to prevent a variation in the scan signals supplied to the scan lines due to coupling capacitance generated by the scan lines and the data lines that are arranged so as to intersect each other in the panel 130 (see FIG. 1), which is caused by maintaining a floating state.

In the second driving period (T2), high-level clock signals are input to the first and second clock terminals (clka and clkb) to turn off the first, fourth and seventh switching elements (M1, M4, and M7). A low-level clock signal is input to the third clock terminal (clkc). As such, the second, third, and sixth switching elements (M2, M3, and M6) are turned on by the voltage stored in the storage capacitor (C1). When the second switching element (M2) is turned on, the low-level clock signal input to the third clock terminal (clkc) is transmitted to the output terminal (Out). When the third switching element (M3) is turned on, the high-level clock signal input to the first clock terminal (clka) is transmitted to the control electrode of the fifth switching element (M5) to turn off the fifth switching element (M5). When the sixth switching element (M6) is turned on, the second power supply source (VDD) is supplied to the control electrode of the eighth switching element (M8) to turn off the eighth switching element (M8). That is, in the second driving period (T2), the second switching element (M2) is turned on by the voltage stored in the storage capacitor, so that the low-level signal input to the third clock terminal (clkc) is output to the output terminal (Out) as an output signal.

Then, before the low-level clock signal is input to the first clock terminal (clka), the clock signals input to the clock terminals are input at a high level during the second delay period (D2), which prevents an error in the output of the scan signal from the scan driver caused by the delay of each element during the operation of the scan circuit. At that time, the second, third, and sixth switching elements (M2, M3, and M6) are turned on by the voltage stored in the storage capacitor (C1), so that the high-level signal input to the third clock terminal (clkc) is output as an output signal. That is, in this structure, the signal output from the output terminal of the scan driving circuit can be maintained in a non-floating state, which makes it possible to prevent a variation in the scan signals supplied to the scan lines due to coupling capacitance generated by the scan lines and the data lines that are arranged so as to intersect each other in the panel 130 (see FIG. 1), which is caused by a floating state.

In the third driving period (T3), high-level clock signals are input to the second and third clock terminals (clkb and clkc) to turn off the first switching element (M1), and a low-level clock signal is input to the first clock terminal (clka) to turn on the fourth and seventh switching elements (M4 and M7). When the fourth switching element (M4) is turned on, the first power supply source (VSS) is supplied to the control electrode of the fifth switching element (M5). The fifth switching element (M5) supplied with the first power supply source (VSS) is turned on so that the second power supply source (VDD) is output to the output terminal (Out). When the seventh switching element (M7) is turned on, the first power supply source (VSS) is supplied to the eighth switching element (M8) so that the eighth switching element (M8) is turned on. When the eighth switching element (M8) is turned on, the second power supply source (VDD) is supplied to the second, third, and sixth switching elements (M2, M3, and M6), so that the second, third, and sixth switching elements (M2, M3, and M6) are turned off. Then, the second power supply source (VDD) is supplied to the storage capacitor (C1) to initialize the storage capacitor C1, which prevents an unnecessary signal from being supplied to the output terminal and prevents a leakage current caused by the voltage stored in the storage capacitor (C1). That is, in the third driving period (T3), the fourth switching element (M4) is turned on so that the first power supply source (VSS) is supplied to the control electrode of the fifth switching element (M5) to turn on the fifth switching element (M5). Then, the second power supply source (VDD) is output from the output terminal (Out) as an output signal.

Figure 5:
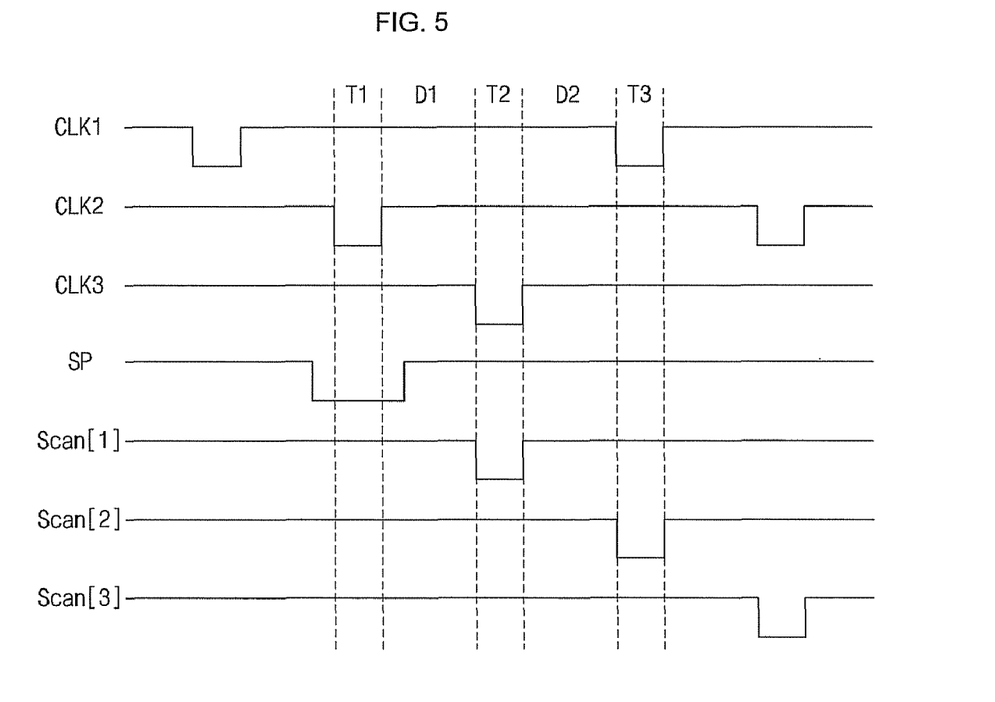
FIG. 5 is a timing chart illustrating the operation of the scan driver described in FIG. 2.

FIG. 5 is a timing chart illustrating the operation of the first scan driver (S1) described in FIG. 2. The scan driver timing chart illustrated in FIG. 5 is composed of the scan circuit described in FIG. 3. That is, the operation of the first to 3n-th scan drivers (S1 to S3$n$) is the same as that described in the timing chart of FIG. 4 illustrating the operation of the scan circuit. As shown in FIG. 5, the timing chart of the scan driver includes a first driving period (T1), a first delay period (D1), a second driving period (T2), a second delay period (D2), and a third driving period (T3).

First, during the first driving period (T1), in the first scan driver (S1), the first clock terminal (clka) is electrically coupled to the first clock line (CLK1), the second clock terminal (clkb) is electrically coupled to the second clock line (CLK2), and the third clock terminal (clkc) is electrically coupled to the third clock line (CLK3). In addition, the input terminal (In) is electrically coupled to an initial driving line (Sp). The first scan driver (S1) receives a low-level initial driving signal and outputs the first scan signal to the first scan line (Scan[1]) electrically coupled to the output terminal (Out). In this case, the operation of the first scan driver (S1) is the same as that of the scan driving circuit during the first driving period (T1) described in FIG. 4.

Then, before the low-level clock signal is supplied to the third clock line (CLK3), the high levels of the clock signals input to the first to third clock lines (CLK1 to CLK3) overlap one another during the first delay period (D1), which makes it possible to ensure a margin for clock skew or delay during the operation of the scan circuit. At that time, the voltage stored in the storage capacitor (C1) causes each of the scan drivers to output the same output signal as that in the first driving period (T1). That is, in this structure, the signal output from the output terminal of the scan driving circuit can be maintained in a non-floating state, which makes it possible to prevent a variation in the scan signals supplied to the scan lines due to coupling capacitance generated by the scan lines and the data lines that are arranged so as to intersect each other in the panel 130 (see FIG. 1), which is caused by a floating state.

During the second driving period (T2), in the first scan driver (S1), the first clock terminal (clka) is electrically coupled to the first clock line (CLK1), the second clock terminal (clkb) is electrically coupled to the second clock line (CLK2), and the third clock terminal (clkc) is electrically coupled to the third clock line (CLK3). In addition, the input terminal (In) is electrically coupled to the initial driving line (Sp). The first scan driver (S1) receives the clock signals supplied to the first to third clock lines (CLK1 to CLK3) and outputs the first scan signal to the first scan line (Scan[1]) electrically coupled to the output terminal (Out). In this case, the operation of the first scan driver (S1) is the same as that of the scan driving circuit during the second driving period (T2) described in FIG. 4.

During the second driving period (T2) and in the second scan driver (S2), the first clock terminal (clka) is electrically coupled to the second clock line (CLK2), the second clock terminal (clkb) is electrically coupled to the third clock line (CLK3), and the third clock terminal (clkc) is electrically coupled to the first clock line (CLK1) as illustrated in FIG. 2 above. In addition, the input terminal (In) is electrically coupled to the first scan line (Scan[1]). The second scan driver (S2) receives the first scan signal at the low-level through the first scan line (Scan[1]) and outputs the second scan signal to the second scan line (Scan[2]) electrically coupled to the output terminal (Out). In this case, the operation of the second scan driver (S2) in the second driving period (T2) is the same as that of the scan driving circuit during the first driving period (T1) described in FIG. 4.

Next, before the low-level clock signal is supplied to the first clock line (CLK1), the clock signals input to the first to third clock lines (CLK1 to CLK3) are input at a high level during the second delay period (D2), which makes it possible to ensure a margin for clock skew or delay during the operation of the scan circuit. At that time, each of the scan drivers performs the same operation as that in the second driving period (T2) by the voltage stored in the storage capacitor (C1), and outputs the clock signal input to the third clock line (CLK3) as an output signal. That is, in this structure, the signal output from the output terminal of the scan driving circuit can be maintained in a non-floating state, which makes it possible to prevent a variation in the scan signals supplied to the scan lines due to coupling capacitance generated by the scan lines and the data lines that are arranged so as to intersect each other in the panel 130 (see FIG. 1), which is caused by a floating state.

During the third driving period (T3), in the first scan driver (S1), the first clock terminal (clka) is electrically coupled to the first clock line (CLK1), the second clock terminal (clkb) is electrically coupled to the second clock line (CLK2), and the third clock terminal (clkc) is electrically coupled to the third clock line (CLK3). In addition, the input terminal (In) is electrically coupled to the initial driving line (Sp). The first scan driver (S1) receives the clock signals supplied to the first to third clock lines (CLK1 to CLK3) and outputs the first scan signal to the first scan line (Scan[1]), which is electrically coupled to the output terminal (Out). In this case, the operation of the first scan driver (S1) is the same as that of the scan driving circuit during the third driving period (T3) described in FIG. 4.

During the third driving period (T3) and in the second scan driver (S2), the first clock terminal (clka) is electrically coupled to the second clock line (CLK2), the second clock terminal (clkb) is electrically coupled to the third clock line (CLK3), and the third clock terminal (clkc) is electrically coupled to the first clock line (CLK1). In addition, the input terminal In is electrically coupled to the first scan line (Scan [1]). The second scan driver (S2) receives the clock signals supplied to the first to third clock lines (CLK1 to CLK3) and outputs the second scan signal to the second scan line (Scan [2]) electrically coupled to the output terminal (Out). In this case, the operation of the second scan driver (S2) is the same as that of the scan driving circuit during the second driving period (T2) described in FIG. 4.

During the third driving period (T3) and in the third scan driver (S3), the first clock terminal (clka) is electrically coupled to the third clock line (CLK3), the second clock terminal (clkb) is electrically coupled to the first clock line (CLK1), and the third clock terminal (clkc) is electrically coupled to the second clock line (CLK2). In addition, the input terminal In is electrically coupled to the second scan line (Scan[2]). The third scan driver (S3) receives the second scan signal at a low level through the second scan line (Scan [2]) and outputs the third scan signal to the third scan line (Scan[3]) electrically coupled to the output terminal (Out). In this case, the operation of the third scan driver (S3) is the same as that of the scan driving circuit during the first driving period (T1) described in FIG. 4.

In the subsequent driving periods, the operation of the first to third scan drivers is the same as that in the first to third driving periods. The connection structure of the clock terminals (clka to clkc) of each of the fourth scan driver (S4), the seventh scan driver (S7), . . . , and the (3n−2)-th scan driver (S3n-2) is the same as that of the first scan driver. The fourth scan driver (S4), the seventh scan driver (S7), . . . , and the (3n−2)-th scan driver (S3n-2) have the input terminals (In) electrically coupled to the previous scan lines (Scan[3], Scan [6], . . . , and Scan[3n-3]), and output scan signals to the scan lines (Scan[4], Scan[7], . . . , and Scan[3n-2]) electrically coupled to the output terminals (Out), respectively. The connection structure of the clock terminals (clka to clkc) of each of the fifth scan driver (S5), the eighth scan driver (S8), . . . , and the (3n−1)-th scan driver (S3n-1) is the same as that of the second scan driver. The fifth scan driver (S5), the eighth scan driver (S8), . . . , and the (3n−1)-th scan driver (S3n-1) have the input terminals (In) electrically coupled to the previous scan lines (Scan[4], Scan[7], . . . , and Scan[3n-2]), and output scan signals to the scan lines (Scan[4], Scan[7], . . . , and Scan[3n-2]) electrically coupled to the output terminals (Out), respectively. The connection structure of the clock terminals (clka to clkc) of each of the sixth scan driver (S6), the ninth scan driver (S9), . . . , and the 3n-th scan driver (S3n) is the same as that of the third scan driver. The sixth scan driver (S6), the ninth scan driver (S9), . . . , and the 3n-th scan driver (S3n) have the input terminals (in) electrically coupled to the previous scan lines (Scan[5], Scan[8], . . . , and Scan [3n-1]), and output scan signals to the scan lines (Scan[6], Scan[9], . . . , and Scan[3n]) electrically coupled to the output terminals (Out), respectively. That is, the scan drivers receive the scan signals input to their input terminals (In) electrically coupled to the previous scan lines and output the scan signals.

Figure 6:
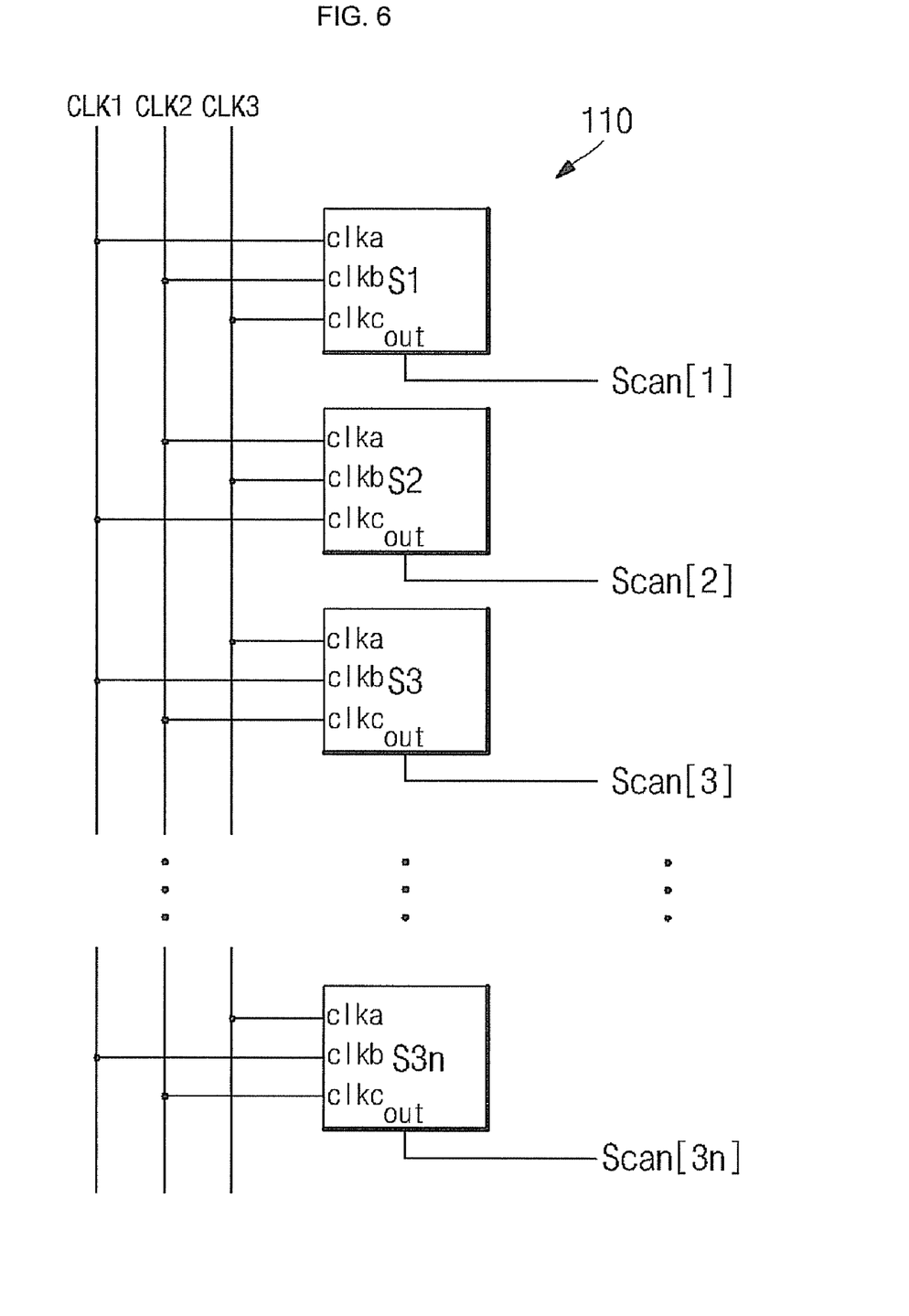
FIG. 6 is a block diagram illustrating a scan driver according to aspects of the present invention.

FIG. 6 is a block diagram illustrating a scan driver according to aspects of the invention. As described in FIG. 6, a scan driver 110 includes first to 3n-th scan drivers (S1 to S3n). The first scan driver (S1) has a first clock terminal (clka) electrically coupled to a first clock line (CLK1), a second clock terminal (clkb) electrically coupled to a second clock line (CLK2), and a third clock terminal (clkc) electrically coupled to a third clock line (CLK3). The first scan driver (S1) receives clock signals through the first to third clock lines (CLK1 to CLK3) and outputs a first scan signal to a first scan line (Scan[1]) electrically coupled to an output terminal (Out).

The second scan driver (S2) has a first clock terminal (clka) electrically coupled to the second clock line (CLK2), a second clock terminal (clkb) electrically coupled to the third clock line (CLK3), and a third clock terminal (clkc) electrically coupled to the first clock line (CLK1). The second scan driver (S2) receives the clock signals through the first to third clock lines (CLK1 to CLK3) and outputs a second scan signal to a second scan line (Scan[2]) electrically coupled to an output terminal (Out).

The third scan driver (S3) has a first clock terminal (clka) electrically coupled to the third clock line (CLK3), a second clock terminal (clkb) electrically coupled to the first clock line (CLK1), and a third clock terminal (clkc) electrically coupled to the second clock line (CLK2). The third scan driver (S3) receives the clock signals through the first to third clock lines (CLK1 to CLK3) and outputs a third scan signal to a third scan line (Scan[3]) electrically coupled to an output terminal (Out).

The connection structure of clock terminals (clka to clkc) of each of a fourth scan driver (S4), a seventh scan driver (S7), . . . , and a (3n−2)-th scan driver (S3n-2) is the same as that of the first scan driver. In addition, the fourth scan driver (S4), the seventh scan driver (S7), and the (3n−2)-th scan driver (S3n-2) output scan signals to the scan lines (Scan[4], Scan[7], and Scan[3n-2]) electrically coupled to their output terminals (Out), respectively.

The connection structure of clock terminals (clka to clkc) of each of a fifth scan driver (S5), an eighth scan driver (S8), . . . , and a (3n−1)-th scan driver (S3n-1) is the same as that of the second scan driver. In addition, the fifth scan driver (S5), the eighth scan driver (S8), and the (3n−1)-th scan driver (S3n-1) output scan signals to the scan lines (Scan[5], Scan [8], and Scan[3n-1]) electrically coupled to their output terminals (Out), respectively.

The connection structure of clock terminals (clka to clkc) of each of a sixth scan driver (S6), a ninth scan driver (S9), . . . , and a 3n-th scan driver (S3n) is the same as that of the third scan driver. In addition, the sixth scan driver (S6), the ninth scan driver (S9), . . . , and the 3n-th scan driver (S3n) output scan signals to the scan lines (Scan[6], Scan[9], . . . , and Scan[3n]) electrically coupled to their output terminals (Out), respectively.

Figure 7:
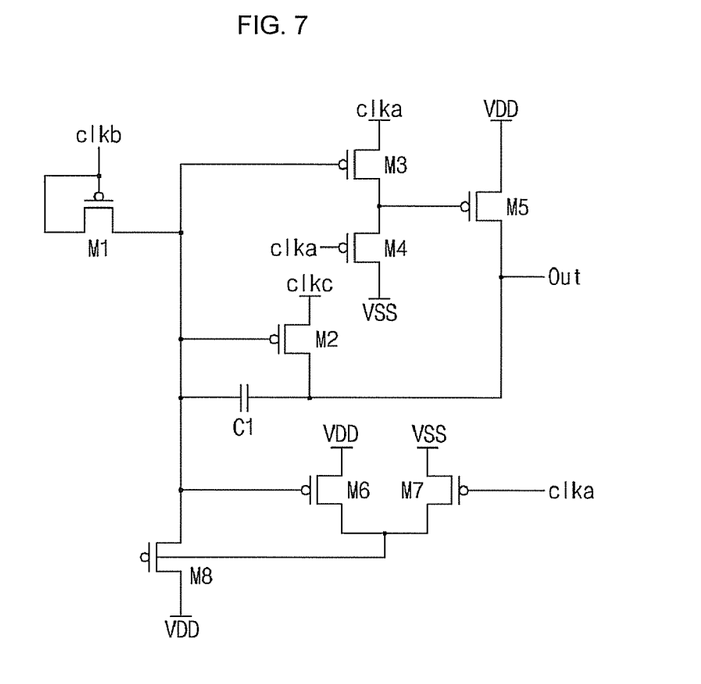
FIG. 7 is a circuit diagram illustrating a scan driver described in FIG. 6.

FIG. 7 is a circuit diagram illustrating the scan driver as described in FIG. 6. All the scan drivers described below have the same scan driving circuit structure as the scan driver described in FIG. 6. That is, the first to 3n-th scan drivers (S1) to (S3n) have the same scan circuit as described in FIG. 7.

As described in FIG. 7, the scan driving circuit includes a first switching element (M1), a second switching element (M2), a third switching element (M3), a fourth switching element (M4), a fifth switching element (M5), a sixth switching element (M6), a seventh switching element (M7), an eighth switching element (M8), and a storage capacitor (C1).

The first switching element (M1) has a first electrode electrically coupled to the second clock terminal (clkb), a second electrode electrically coupled to control electrodes of the second, third, and sixth switching elements (M2, M3, and M6), and a control electrode electrically coupled to the second clock terminal (clkb). When a low-level clock signal is supplied to the control electrode of the first switching element (M1), the first switching element (M1) is turned on, so that the clock signal input to the second clock terminal (clkb) is supplied to the control electrodes of the second, third, sixth switching elements (M2, M3, and M6). That is, the first switching element (M1) is an initial driving switching element that supplies a signal for the initial driving of the scan circuit, which is input to the second clock terminal (clkb), to each element to drive each element.

The second switching element (M2) has a first electrode electrically coupled to the third clock terminal (clkc), a second electrode electrically coupled to the output terminal (Out), and a control electrode electrically coupled to the second electrode of the first switching element (M1) between the control electrodes of the third and sixth switching elements (M3 and M6). When the low-level signal transmitted from the first switching element is supplied to the control electrode of the second switching element (M2), the second switching element (M2) outputs a clock signal input to the third clock terminal (clkc) to the output terminal (Out).

The third switching element (M3) has a first electrode electrically coupled to the first clock terminal (clka), a second electrode electrically coupled between a first electrode of the fourth switching element (M4) and a control electrode of the fifth switching element (M5), and a control electrode electrically coupled to the second electrode of the first switching element (M1) between the control electrodes of the second and sixth switching elements (M2 and M6). When the low-level signal transmitted from the first switching element is supplied to the control electrode of the third switching element (M3), the third switching element (M3) outputs a clock signal input to the first clock terminal (clka) to the control electrode of the fifth switching element (M5).

The fourth switching element (M4) has a first electrode electrically coupled to the control electrode of the fifth switching element (M5), a second electrode electrically coupled to a first power supply source VSS, and a control electrode electrically coupled to the first clock terminal (clka). When a low-level clock signal is supplied from the first clock terminal (clka) to the control electrode of the fourth switching element (M4), the fourth switching element (M4) applies the first power supply source (VSS) to the control electrode of the fifth switching element (M5).

The fifth switching element (M5) has a first electrode electrically coupled to a second power supply source (VDD), a second electrode electrically coupled to the output terminal (Out), and a control electrode electrically coupled between the third and fourth switching elements (M3 and M4). When the low-level signal is supplied from the third or fourth switching element (M3 or M4) to the control electrode of the fifth switching element (M5), the fifth switching element (M5) outputs a second power supply source (VDD) to the output terminal (Out).

The sixth switching element (M6) has a first electrode electrically coupled to the second power supply source (VDD), a second electrode electrically coupled to the control electrode of the eighth switching element (M8), and a control electrode electrically coupled to the second electrode of the first switching element (M1) between the control electrodes of the second and third switching elements (M2 and M3). When the low-level signal is supplied from the first switching element (M1) to the control electrode of the sixth switching element (M6), the sixth switching element (M6) outputs the second power supply source (VDD) to the control electrode of the eighth switching element (M8).

The seventh switching element (M7) has a first electrode electrically coupled to the first power supply source (VSS), a second electrode electrically coupled to the control electrode of the eighth switching element (M8), and a control electrode electrically coupled to the first clock terminal (clka). When a low-level clock signal input to the first clock terminal (clka) is supplied to the control electrode of the seventh switching element (M7), the seventh switching element (M7) applies the first power supply source (VSS) to the control electrode of the eighth switching element (M8).

The eighth switching element (M8) has a first electrode electrically coupled to the control electrode of the sixth switching element (M6), a second electrode electrically coupled to the second power supply source (VDD), and a control electrode electrically coupled between the sixth and seventh switching elements (M6 and M7). When the low-level signal transmitted from the seventh switching element (M7) is supplied to the control electrode of the eighth switching element (M8), the eighth switching element (M8) applies the second power supply source (VDD) to the storage capacitor (C1) to initialize a voltage stored in the storage capacitor (C1) and fix the voltages of the control electrodes of the second, third, and sixth switching elements (M2, M3, and M6) to the second power supply source (VDD).

The storage capacitor (C1) has a first electrode electrically coupled to the control electrode of the second switching element (M2) and a second electrode electrically coupled between the output terminal (Out) and the second electrode of the second switching element (M2). The storage capacitor (C1) stores a voltage difference between the control electrode and the second electrode of the second switching element (M2).

Figure 8:
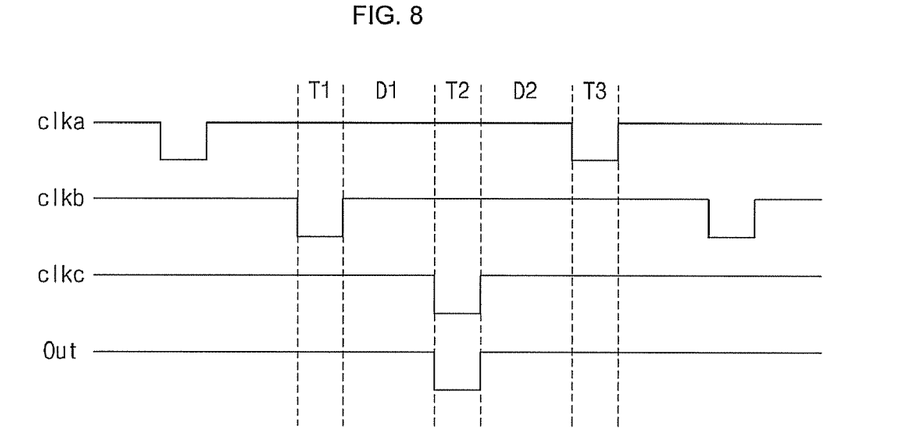
FIG. 8 is a timing chart illustrating the operation of a scan circuit described in FIG. 7.

FIG. 8 is a timing chart illustrating the operation of the scan driving circuit described in FIG. 7. The operation of the scan circuit described in FIG. 7 will be described below. As illustrated in FIG. 8, the timing chart of the scan circuit includes a first driving period (T1), a first delay period (D1), a second driving period (T2), a second delay period (D2), and a third driving period (T3).

First, in the first driving period (T1), high-level clock signals are input to the first and third clock terminals (clka and clkc) to turn off the fourth and seventh switching elements (M4 and M7), and a low-level clock signal is input to the second clock terminal (clkb) to turn on the first switching element (M1). When the first switching element (M1) is turned on, the low-level clock signal input to the second clock terminal (clkb) is supplied to the control electrodes of the second, third, and sixth switching elements (M2, M3, and M6) to turn on the second, third, and sixth switching elements (M2, M3, and M6). When the second switching element (M2) is turned on, the high-level clock signal input to the third clock terminal (clkc) is transmitted to the output terminal (Out). At that time, the storage capacitor (C1) is electrically coupled between the control electrode of the second switching element (M2) and the output terminal (Out) to store a voltage corresponding to the difference between the low level of the control electrode of the second switching element (M2) and the high level of the output terminal (Out). When the third switching element (M3) is turned on, the high-level clock signal input to the first clock terminal (clka) is transmitted to the control electrode of the fifth switching element (M5) to turn off the fifth switching element (M5). When the sixth switching element (M6) is turned on, the second power supply source (VDD) is supplied to the control electrode of the eighth switching element (M8) to turn off the eighth switching element (M8). That is, in the first driving period (T1), the low-level clock signal transmitted through the first switching element (M1) turns on the second switching element (M2), so that the high-level signal input to the third clock terminal (clkc) is output as an output signal.

Next, before the low-level clock signal is input to the third clock terminal (clkc) in the second driving period (T2), the clock signals input to the clock terminals (clka to clkc) are input at a high level during the first delay period (D1), which prevents an error in the output of the scan signal from the scan driver caused by a delay of each element during the operation of the scan circuit. At that time, the second, third, and sixth switching elements (M2, M3, and M6) are turned on by the voltage stored in the storage capacitor (C1), so that the same output signal as that in the first driving period (T1) is output. That is, in this structure, the signal output from the output terminal of the scan driving circuit can be maintained in a non-floating state, which makes it possible to prevent a variation in the scan signals supplied to the scan lines caused by a floating state due to coupling capacitance generated by the scan lines and the data lines that are arranged so as to intersect each other in the panel 130 (see FIG. 1).

In the second driving period (T2), high-level clock signals are input to the first and second clock terminals (clka and clkb) to turn off the first, fourth and seventh switching elements (M1, M4, and M7). A low-level clock signal is input to the third clock terminal (clkc), and the second, third, and sixth switching elements (M2, M3, and M6) are turned on by the voltage stored in the storage capacitor (C1). When the second switching element (M2) is turned on, the low-level clock signal input to the third clock terminal (clkc) is transmitted to the output terminal (Out). When the third switching element (M3) is turned on, the high-level clock signal input to the first clock terminal (clka) is transmitted to the control electrode of the fifth switching element (M5) to turn off the fifth switching element (M5). When the sixth switching element (M6) is turned on, the second power supply source (VDD) is supplied to the control electrode of the eighth switching element (M8) to turn off the eighth switching element (M8). That is, in the second driving period (T2), the second switching element (M2) is turned on by the voltage stored in the storage capacitor, so that the low-level signal input to the third clock terminal (clkc) is output as an output signal.

Again, before the low-level clock signal is input to the first clock terminal (clka) in the third driving period (T3), the clock signals input to the clock terminals are input at a high level during the second delay period (D2), which prevents an error in the output of the scan signal from the scan driver caused by the delay of each element during the operation of the scan circuit. At that time, the second, third, and sixth switching elements (M2, M3, and M6) are turned on by the voltage stored in the storage capacitor (C1), so that the high-level signal input to the third clock terminal (clkc) is output as an output signal, similar to the second driving period (T2). That is, in this structure, the signal output from the output terminal of the scan driving circuit can be maintained in a non-floating state, which makes it possible to prevent a variation in the scan signals supplied to the scan lines caused by a floating state due to coupling capacitance generated by the scan lines and the data lines that are arranged so as to intersect each other in the panel 130 (see FIG. 1).

In the third driving period (T3), high-level clock signals are input to the second and third clock terminals (clkb and clkc) to turn off the first switching element (M1), and a low-level clock signal is input to the first clock terminal (clka) to turn on the fourth and seventh switching elements (M4 and M7). When the fourth switching element (M4) is turned on, the first power supply source (VSS) is supplied to the control electrode of the fifth switching element (M5). The fifth switching element (M5) supplied with the first power supply source (VSS) is turned on, so that the second power supply source (VDD) is output to the output terminal (Out). When the seventh switching element (M7) is turned on, the first power supply source (VSS) is supplied to the control electrode of the eighth switching element (M8) so that the second power supply source (VDD) is supplied to the control electrodes of the second, third, and sixth switching elements (M2, M3, and M6), so that the second, third, and sixth switching elements (M2, M3, and M6) are turned off. Then, the second power supply source (VDD) is supplied to the storage capacitor (C1) to initialize the storage capacitor (C1), which prevents an unnecessary signal from being supplied to the output terminal and prevents a leakage current caused by the voltage stored in the storage capacitor (C1). That is, in the third driving period (T3), the fourth switching element (M4) is turned on, so that the first power supply source (VSS) is supplied to the control electrode of the fifth switching element (M5) to turn on the fifth switching element (M5). Then, the second power supply source (VDD) is output from the output terminal (Out) as an output signal.

Figure 9:
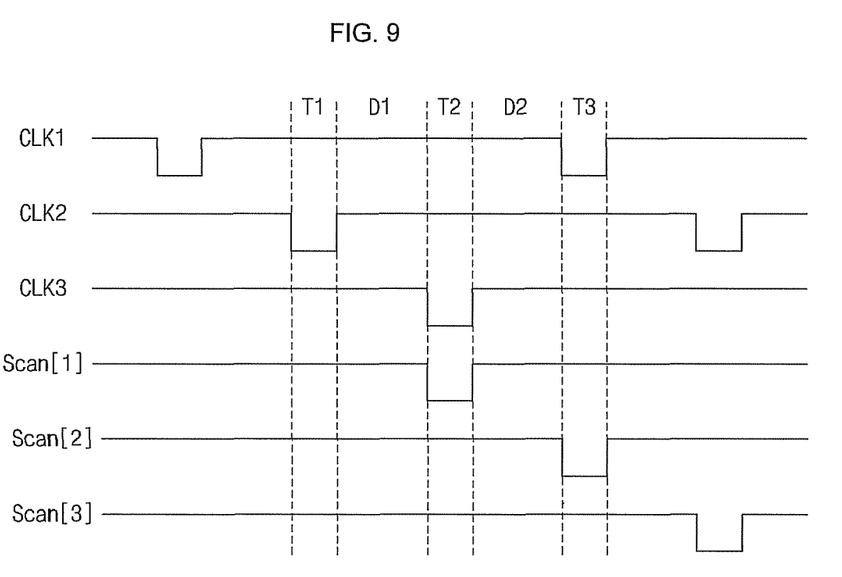
FIG. 9 is a timing chart illustrating the operation of the scan driver described in FIG. 6.

FIG. 9 is a timing chart illustrating the operation of the scan driver described in FIG. 6. The scan driver described in FIG. 9 includes the scan circuit described in FIG. 7. That is, the operation of the first to 3n-th scan drivers (S1 to S3n) is the same as that described in the timing chart of FIG. 8 illustrating the operation of the scan circuit.

As illustrated in FIG. 9, the timing chart of the scan driver includes a first driving period (T1), a first delay period (D1), a second driving period (T2), a second delay period (D2), and a third driving period (T3).

First, during the first driving period (T1), in the first scan driver (S1), the first clock terminal (clka) is electrically coupled to the first clock line (CLK1), the second clock terminal (clkb) is electrically coupled to the second clock line (CLK2), and the third clock terminal (clkc) is electrically coupled to the third clock line (CLK3). The first scan driver (S1) receives the second clock signal at a low level through the second clock line (CLK2) and outputs the first scan signal to the first scan line (Scan[1]) electrically coupled to the output terminal (Out). In this case, the operation of the first scan driver (S1) is the same as that of the scan driving circuit during the first driving period (T1) described in FIG. 8.

Next, before the low-level clock signal is supplied to the third clock line (CLK3) in the second driving period (T2), the clock signals input to the first to third clock lines (CLK1 to CLK3) are input at a high level during the first delay period (D1), which makes it possible to ensure a margin for clock skew or delay during the operation of the scanning. At that time, the voltage stored in the storage capacitor (C1) causes each of the scan drivers to output the same output signal as that in the first driving period (T1). That is, in this structure, the signal output from the output terminal of the scan driving circuit can be maintained in a non-floating state, which makes it possible to prevent a variation in the scan signals supplied to the scan lines is caused by a floating state due to coupling capacitance generated by the scan lines and the data lines that are arranged so as to intersect each other in the panel 130 (see FIG. 1).

During the second driving period (T2), in the first scan driver (S1), the first clock terminal (clka) is electrically coupled to the first clock line (CLK1), the second clock terminal (clkb) is electrically coupled to the second clock line (CLK2), and the third clock terminal (clkc) is electrically coupled to the third clock line (CLK3). The first scan driver (S1) receives the clock signals supplied to the first to third clock lines (CLK1 to CLK3) and outputs the first scan signal to the first scan line (Scan[1]) electrically coupled to the output terminal (Out). In this case, the operation of the first scan driver (S1) is the same as that of the scan driving circuit during the second driving period (T2) described in FIG. 8. In the second scan driver (S2), the first clock terminal (clka) is electrically coupled to the second clock line (CLK2), the second clock terminal (clkb) is electrically coupled to the third clock line (CLK3), and the third clock terminal (clkc) is electrically coupled to the first clock line (CLK1). The second scan driver (S2) receives a low level signal from the third clock line (CLK3) through the second clock terminal (clkb) and outputs the second scan signal to the second scan line (Scan[2]) electrically coupled to the output terminal (Out). In this case, the operation of the second scan driver (S2) is the same as that of the scan driving circuit during the first driving period (T1) described in FIG. 8.

Again, before the low-level clock signal is supplied to the first clock line (CLK1) in the third driving period (T3), the clock signals input to the first to third clock lines (CLK1 to CLK3) are input at a high level during the second delay period (D2), which makes it possible to ensure a margin for clock skew or delay during the operation of the scan circuit. At that time, each of the scan drivers performs the same operation as that in the second driving period (T2) as driven by the voltage stored in the storage capacitor (C1), and outputs the clock signal input to the third clock line (CLK3) as an output signal. That is, in this structure, the signal output from the output terminal of the scan driving circuit can be maintained in a non-floating state, which makes it possible to prevent a variation in the scan signals supplied to the scan lines caused by a floating state due to coupling capacitance generated by the scan lines and the data lines that are arranged so as to intersect each other in the panel 130 (see FIG. 1).

During the third driving period (T3), in the first scan driver (S1), the first clock terminal (clka) is electrically coupled to the first clock line (CLK1), the second clock terminal (clkb) is electrically coupled to the second clock line (CLK2), and the third clock terminal (clkc) is electrically coupled to the third clock line (CLK3). The first scan driver (S1) receives the clock signals supplied to the first to third clock lines (CLK1 to CLK3) and outputs the first scan signal to the first scan line (Scan[1]) electrically coupled to the output terminal (Out). In this case, the operation of the first scan driver (S1) is the same as that of the scan driving circuit during the third driving period (T3) described in FIG. 8. In the second scan driver (S2), the first clock terminal (clka) is electrically coupled to the second clock line (CLK2), the second clock terminal (clkb) is electrically coupled to the third clock line (CLK3), and the third clock terminal (clkc) is electrically coupled to the first clock line (CLK1). The second scan driver (S2) receives the clock signals supplied to the first to third clock lines (CLK1 to CLK3) and outputs the second scan signal to the second scan line (Scan[2]) electrically coupled to the output terminal (Out). In this case, the operation of the second scan driver (S2) is the same as that of the scan driving circuit during the second driving period (T2) described in FIG. 8. In the third scan driver (S3), the first clock terminal (clka) is electrically coupled to the third clock line (CLK3), the second clock terminal (clkb) is electrically coupled to the first clock line (CLK1), and the third clock terminal (clkc) is electrically coupled to the second clock line (CLK2). The third scan driver (S3) receives the low level signal from the first clock line (CLK1) through the second clock terminal (clkb) and outputs the third scan signal to the third scan line (Scan[3]) electrically coupled to the output terminal (Out). In this case, the operation of the third scan driver (S3) is the same as that of the scan driving circuit during the first driving period (T1) described in FIG. 8.

In the subsequent driving periods, the operation of the first to third scan drivers (S1 to Sn3) is the same as that in the first to third driving periods (T1 to T3). The connection structure of the clock terminals (clka to clkc) of each of the fourth scan driver (S4), the seventh scan driver (S7), . . . , and the (3n−2)-th scan driver (S3n-2) is the same as that of the first scan driver (S1). The fourth scan driver (S4), the seventh scan driver (S7), . . . , and the (3n−2)-th scan driver (S3n-2) output scan signals to the scan lines (Scan[4], Scan[7], . . . , and Scan[3n-2]) electrically coupled to their output terminals (Out), respectively. The connection structure of the clock terminals (clka to clkc) of each of the fifth scan driver (S5), the eighth scan driver (S8), . . . , and the (3n−1)-th scan driver (S3n-1) is the same as that of the second scan driver (S2). The fifth scan driver (S5), the eighth scan driver (S8), . . . , the (3n−1)-th scan driver (S3n-1) output scan signals to the scan lines (Scan[5], Scan[8], . . . , and Scan[3n-1]) electrically coupled to their output terminals (Out), respectively. The connection structure of the clock terminals (clka to clkc) of each of the sixth scan driver (S6), the ninth scan driver (S9), . . . , and the 3n-th scan driver (S3n) is the same as that of the third scan driver (S3). The sixth scan driver (S6), the ninth scan driver (S9), . . . , the 3n-th scan driver (S3n) output scan signals to the scan lines (Scan[6], Scan[9], . . . , and Scan[3n]) electrically coupled to their output terminals (Out), respectively. That is, the scan drivers receive the scan signals input from the first, second, and third clock lines (CLK1, CLK2, and CLK3) and output the scan signals to the scan lines (Scan[1] to Scan[3n]).

As described above, the organic light emitting display and the driving circuit therefor according to the above-described embodiments of the invention can prevent a variation in the scan signals supplied to the scan lines due to coupling capacitance caused by the scan lines and the data lines that intersect each other in the organic light emitting display panel. Further, as described above, the organic light emitting display and the driving circuit therefor according to the above-described aspects of the invention can prevent a variation in scan signals due to a leakage current from the output terminal.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A driving circuit, comprising:
  a first scan driver which has a first clock terminal electrically coupled to a first clock line, a second clock terminal electrically coupled to a second clock line, and a third clock terminal electrically coupled to a third clock line;
  a second scan driver which has a first clock terminal electrically coupled to the second clock line, a second clock terminal electrically coupled to the third clock line, and a third clock terminal electrically coupled to the first clock line;
  a third scan driver which has a first clock terminal electrically coupled to the third clock line, a second clock terminal electrically coupled to the first clock line, and a third clock terminal electrically coupled to the second clock line,
  a first switching element which has a control electrode electrically coupled to the second clock terminal and is electrically coupled between an input line and the first clock terminal;
  a second switching element which has a control electrode electrically coupled to the first switching element and is electrically coupled between the third clock terminal and an output line;
  a third switching element which has a control electrode electrically coupled to the first switching element and is electrically coupled between the first clock terminal and a first power supply line;
  a fourth switching element which has a control electrode electrically coupled to the first clock terminal and is electrically coupled between the third switching element and the first power supply line;
  a fifth switching element which has a control electrode electrically coupled between the third switching element and the fourth switching element and is electrically coupled between a second power supply line and the output line;
  a sixth switching element which has a control electrode electrically coupled to the first switching element and is electrically coupled between the first power supply line and the second power supply line;
  a seventh switching element which has a control electrode electrically coupled to the first clock terminal and is electrically coupled between the first power supply line and the sixth switching element;
  an eighth switching element which has a control electrode electrically coupled between the sixth switching element and the seventh switching element and is electrically coupled between the control electrode of the sixth switching element and the second power supply line; and
  a storage capacitor which is electrically coupled between the control electrode of the second switching element and the output line.

2. The driving circuit of claim 1,
wherein the first scan driver further includes an input terminal which is electrically coupled to an initial input line and an output terminal electrically coupled to a first scan line.

3. The driving circuit of claim 2,
wherein the second scan driver further includes an input terminal which is electrically coupled to the first scan line and an output terminal electrically coupled to a second scan line.

4. The driving circuit of claim 3,
wherein the third scan driver further includes an input terminal which is electrically coupled to the second scan line and an output terminal electrically coupled to a third scan line.

5. The driving circuit of claim 1,
wherein the first, second, and third scan drivers respectively comprise input terminals electrically connected to an initial input line or the output line of a scan driver in a previous stage.

6. The driving circuit of claim 1,
wherein the output line is a scan line electrically coupled to a pixel circuit.

7. The driving circuit of claim 1,
wherein the first switching element has a first electrode electrically coupled to the initial input line, and a second electrode electrically coupled between the control electrode of the second switching element and the control electrode of the fourth switching element.

8. The driving circuit of claim 1,
wherein the second switching element has the control electrode electrically coupled to the control electrode of the third switching element, a first electrode electrically coupled to the third clock terminal, and a second electrode electrically coupled to the output line.

9. The driving circuit of claim 1,
wherein the third switching element has the control electrode electrically coupled to the control electrode of the second switching element, a first electrode electrically coupled to the first clock terminal, and a second electrode electrically coupled between a first electrode of the fourth switching element and the control electrode of the fifth switching element.

10. The driving circuit of claim 1,
wherein the fourth switching element has a first electrode electrically coupled to the control electrode of the fifth switching element and a second electrode electrically coupled to the first power supply line.

11. The driving circuit of claim 1,
wherein the fifth switching element has a first electrode electrically coupled to the second power supply line and a second electrode electrically coupled to the output line.

12. The driving circuit of claim 1,
wherein the sixth switching element has the control electrode electrically coupled between the control electrode of the second switching element and the control electrode of the fourth switching element, a first electrode electrically coupled to the second power supply line, and a second electrode electrically coupled to the control electrode of the eighth switching element.

13. The driving circuit of claim 1,
wherein the seventh switching element has a first electrode electrically coupled to the first power supply line and a second electrode electrically coupled to the control electrode of the eighth switching element.

14. The driving circuit of claim 1,
wherein the eighth switching element has a first electrode electrically coupled to the control electrode of the second switching element and a second electrode electrically coupled to the second power supply line.

15. The driving circuit of claim 1,
wherein the storage capacitor has a first electrode electrically coupled to the control electrode of the second switching element and a second electrode electrically coupled to the output line.

16. The driving circuit of claim 1,
wherein the first scan driver has an output terminal electrically coupled to a first scan line.

17. The driving circuit of claim 1,
wherein the second scan driver has an output terminal electrically coupled to a second scan line.

18. The driving circuit of claim 1,
wherein the third scan driver has an output terminal electrically coupled to a third scan line.

19. The driving circuit of claim 1, wherein
the input line electrically coupled to the first switching element is electrically coupled to the second clock terminal.

20. The driving circuit of claim 19,
wherein the output line is a scan line electrically coupled to a pixel circuit.

21. The driving circuit of claim 19,
wherein the first switching element has a first electrode electrically coupled to the second clock terminal and a second electrode electrically coupled between the control electrode of the second switching element and the control electrode of the fourth switching element.

22. The driving circuit of claim 19,
wherein the second switching element has the control electrode electrically coupled to the control electrode of the third switching element, a first electrode electrically coupled to the third clock terminal, and a second electrode electrically coupled to the output line.

23. The driving circuit of claim 19,
wherein the third switching element has the control electrode electrically coupled to the control electrode of the second switching element, a first electrode electrically coupled to the first clock terminal, and a second electrode electrically coupled between the first electrode of the fourth switching element and the control electrode of the fifth switching element.

24. The driving circuit of claim 19,
wherein the fourth switching element has the control electrode electrically coupled to the first clock terminal, a first electrode electrically coupled to the control electrode of the fifth switching element, and a second electrode electrically coupled to the first power supply line.

25. The driving circuit of claim 19,
wherein the fifth switching element has a first electrode electrically coupled to the second power supply line and a second electrode electrically coupled to the output line.

26. The driving circuit of claim 19,
wherein the sixth switching element has the control electrode electrically coupled between the control electrode of the second switching element and the control electrode of the fourth switching element, a first electrode electrically coupled to the second power supply line, and a second electrode electrically coupled to the control electrode of the eighth switching element.

27. The driving circuit of claim 19,
wherein the seventh switching element has the control electrode electrically coupled to the first clock terminal, a first electrode electrically coupled to the first power supply line, and a second electrode electrically coupled to the control electrode of the eighth switching element.

28. The driving circuit of claim 19,
wherein the eighth switching element has a first electrode electrically coupled to the control electrode of the second switching element, and a second electrode electrically coupled to the second power supply line.

29. The driving circuit of claim 19,
wherein the storage capacitor has a first electrode electrically coupled to the control electrode of the second switching element and a second electrode electrically coupled to the output line.

30. An organic light emitting display comprising the driving circuit of claim 1.

* * * * *